(12) United States Patent
Li

(10) Patent No.: US 11,303,837 B2
(45) Date of Patent: Apr. 12, 2022

(54) READOUT CIRCUIT, IMAGE SENSOR, AND ELECTRONIC DEVICE

(71) Applicant: SHENZHEN GOODIX TECHNOLOGY CO., LTD., Shenzhen (CN)

(72) Inventor: Liang Li, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 248 days.

(21) Appl. No.: 16/714,714

(22) Filed: Dec. 14, 2019

(65) Prior Publication Data

US 2020/0404206 A1 Dec. 24, 2020

Related U.S. Application Data

(63) Continuation of application No. PCT/CN2019/092149, filed on Jun. 20, 2019.

(51) Int. Cl.
*H04N 5/378* (2011.01)
*G11C 27/02* (2006.01)
*H03F 3/45* (2006.01)

(52) U.S. Cl.
CPC .......... *H04N 5/378* (2013.01); *G11C 27/026* (2013.01); *H03F 3/45* (2013.01); *H03F 2203/45156* (2013.01); *H03F 2203/45332* (2013.01)

(58) Field of Classification Search
CPC . H04N 5/378; H03F 3/45; H03F 2203/45156; H03F 2203/45332; H03F 2203/45536; H03F 3/45475; H03F 3/70; H03F 3/45071; G11C 27/02; G11C 27/026
See application file for complete search history.

(56) References Cited

U.S. PATENT DOCUMENTS

| 7,463,231 B2 | 12/2008 | Miura |
| 2006/0050036 A1 | 3/2006 | Miura |
| 2007/0096773 A1* | 5/2007 | Takashima .......... H03M 1/1225 327/94 |

(Continued)

FOREIGN PATENT DOCUMENTS

| CN | 1746964 A | 3/2006 |
| CN | 101282484 A | 10/2008 |
| CN | 102497517 A | 6/2012 |

(Continued)

OTHER PUBLICATIONS

Murari, Kartikeya et al. "A CMOS In-Pixel CTIA High Sensitivity Fluorescence Imager," IEEE transactions on biomedical circuits and systems, vol. 5,5 (2011): 449-458. doi:10.1109/tbcas.2011.2114660, Mar. 24, 2011, 27 pages total.

*Primary Examiner* — Jung Kim

(57) ABSTRACT

A readout circuit, an image sensor and an electronic device are provided, which could effectively reduce an area and power consumption of the image sensor. The readout circuit includes a plurality of capacitors, a switch circuit and an output circuit; where the plurality of capacitors are connected to the output circuit through the switch circuit; the plurality of capacitors are configured to store output signals of a plurality of pixel circuits, respectively; and the output circuit is configured to output signals stored by the plurality of capacitors through the switch circuit one-by-one.

12 Claims, 6 Drawing Sheets

(56) References Cited

U.S. PATENT DOCUMENTS

2010/0073537 A1   3/2010  Kato et al.
2014/0016007 A1   1/2014  Ogura et al.

FOREIGN PATENT DOCUMENTS

| | | |
|---|---|---|
| CN | 107659762 A | 2/2018 |
| CN | 109787563 A | 5/2019 |
| JP | 2017175608 A | 9/2017 |

* cited by examiner

READOUT CIRCUIT, IMAGE SENSOR, AND ELECTRONIC DEVICE

CROSS-REFERENCE TO RELATED APPLICATIONS

This application is a continuation of International Application No. PCT/CN2019/092149, filed on Jun. 20, 2019, the disclosure of which is hereby incorporated by reference in its entirety.

TECHNICAL FIELD

Embodiments of the present application relate to the technical field of readout circuits, and in particular, to a readout circuit, an image sensor, and an electronic device.

BACKGROUND

An image sensor is an apparatus that converts a light signal into an electrical signal. The image sensor generally includes a pixel circuit, a readout circuit, an analog-to-digital conversion circuit and a digital processing circuit, where the pixel circuit may convert a sensed light signal into an electrical signal and then input the electrical signal into the readout circuit, the readout circuit may amplify and read out the electrical signal output by the pixel circuit, the analog-to-digital conversion circuit may convert an analog signal output by the readout circuit into a digital signal, and the digital processing circuit may perform arithmetic processing on the digital signal output by the analog-to-digital conversion circuit.

With the development of society, problems for an area and power consumption of the image sensor have attracted more and more attention. Therefore, how to reduce the area and power consumption of the image sensor is an urgent problem to be solved.

SUMMARY

Embodiments of the present application provide a readout circuit, an image sensor and an electronic device, which could effectively reduce an area and power consumption of the image sensor.

In a first aspect, provided is a readout circuit, including a plurality of capacitors, a switch circuit and an output circuit; where the plurality of capacitors are connected to the output circuit through the switch circuit; the plurality of capacitors are configured to store output signals of a plurality of pixel circuits, respectively; and the output circuit is configured to output signals stored by the plurality of capacitors through the switch circuit one-by-one.

In some possible embodiments, the switch circuit includes a plurality of switches, the plurality of switches are in one-to-one correspondence with the plurality of capacitors, and the output circuit is configured to output the signals stored by the plurality of capacitors one-by-one through sequential turn-on of the plurality of switches.

In some possible embodiments, when the output circuit is configured to output a signal stored by an i-th capacitor of the plurality of capacitors, a switch corresponding to the i-th capacitor is turned on, and other switches in the switch circuit except the switch corresponding to the i-th capacitor are turned off.

In some possible embodiments, the plurality of pixel circuits are pixel circuits in a same direction, the same direction is a same row or a same column.

In some possible embodiments, a number of the plurality of capacitors is less than or equal to a number of the pixel circuits in the same direction.

In some possible embodiments, the plurality of capacitors are configured to simultaneously sample and store the output signals of the plurality of pixel circuits.

In some possible embodiments, when the plurality of capacitors simultaneously sample the output signals of the plurality of pixel circuits, all switches in the switch circuit are turned on.

In some possible embodiments, the output circuit includes an operational amplifier configured to amplify and output the signals stored by the plurality of capacitors.

In some possible embodiments, the output circuit further includes: a feedback capacitor, a first switch, a second switch and a third switch; two ends of the first switch are connected to an input end and an output end of the operational amplifier, respectively, a left plate of the feedback capacitor is connected to the input end of the operational amplifier, a right plate of the feedback capacitor is connected to the output end of the operational amplifier through the third switch, and two ends of the second switch are connected to the right plate of the feedback capacitor and a voltage source, respectively.

In a second aspect, provided is an image sensor including the readout circuit in the first aspect or any possible implementation of the first aspect.

In a third aspect, provided is an electronic device including the readout circuit in the first aspect or any possible implementation of the first aspect.

According to the foregoing technical solution, a readout circuit includes a plurality of (for example, S) capacitors, so that output signals of S pixel circuits may be independently stored and then be output one-by-one, and the pixel circuits of S row (or S column) may share one readout circuit; in this way, the number of readout circuits in an image sensor could be reduced to 1/S of the original value. Due to a small size of the capacitor in the readout circuit, an increased area in the readout circuit after adding the capacitor could be ignored. In addition, power consumption of the readout circuit mainly comes from an output circuit, and power consumption of the readout circuit is almost unchanged after the capacitor is added, so that an area and power consumption of the image sensor could be reduced to 1/S of the original values.

DESCRIPTION OF EMBODIMENTS

Technical solutions in embodiments of the present application will be described hereinafter with reference to the accompanying drawings.

Figure 1:
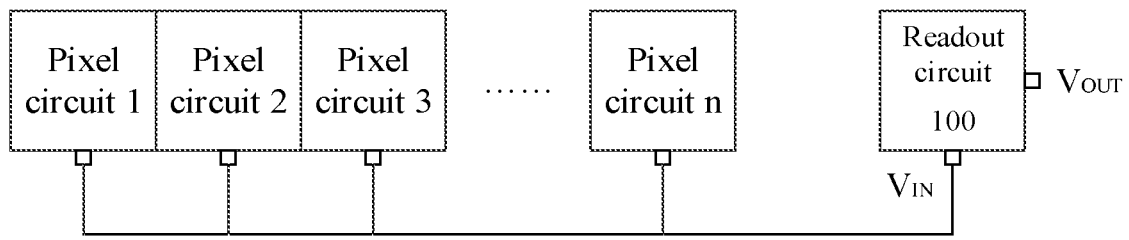
FIG. 1 is a schematic diagram of an application manner of an existing readout circuit.
Figure 2:
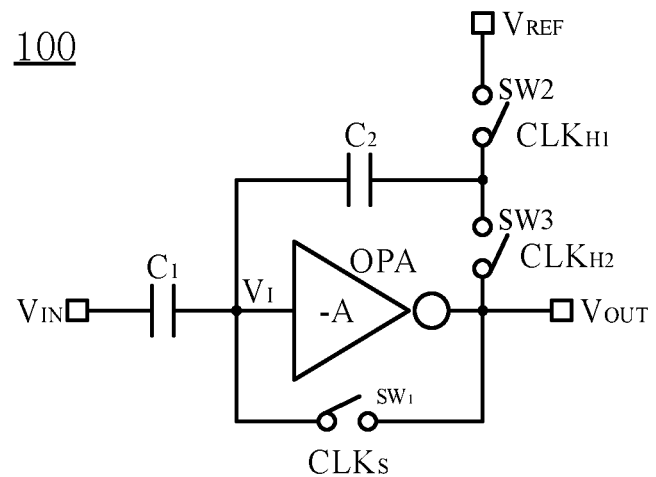
FIG. 2 is a schematic structural diagram of an existing readout circuit.

FIG. 1 is a schematic diagram of an application manner of an existing readout circuit 100. In FIG. 1, one readout circuit is connected to n pixel circuits in one row, and outputs of the pixel circuits are inputs of the readout circuit. A working principle of the readout circuit 100 will be described below with reference to FIGS. 2 and 3. FIG. 2 is a schematic structural diagram of the readout circuit 100 in FIG. 1, and FIG. 3 is a timing diagram of a control manner corresponding to the readout circuit 100.

As shown in FIG. 2, the readout circuit 100 may mainly include the following six parts: ① an input capacitor $C_1$, where a capacitance of the input capacitor $C_1$ is $C_1$; ② a feedback capacitor $C_2$, where a capacitance of the feedback capacitor $C_2$ is $C_2$; ③ an operational amplifier (OPA), where a gain of the OPA is $-A$, ideally A is $\infty$, an input voltage of the OPA is $V_I$, and an output voltage thereof is $V_{OUT}$; ④ a sampling switch $SW_1$, where a control signal of $SW_1$ is $CLK_S$; ⑤ one of two holding switches, $SW_2$, where a control signal of $SW_2$ is $CLK_{H1}$; and ⑥ the other of the two holding switches, $SW_3$, where a control signal of $SW_3$ is $CLK_{H2}$. For ease of description, the foregoing three switches are all defined as: conducting when the control signal is at a high level.

Figure 3:
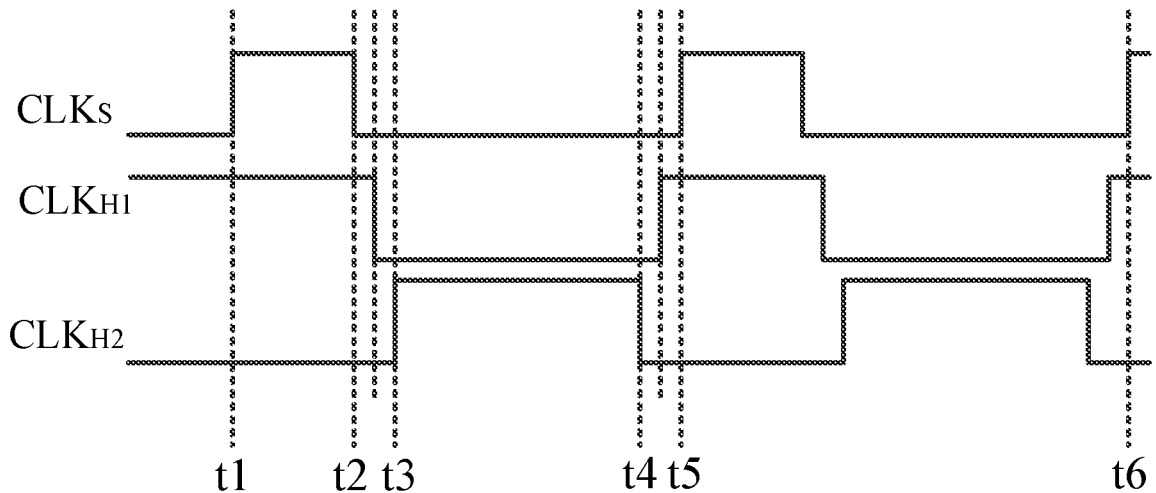
FIG. 3 is a timing diagram of a control manner corresponding to the readout circuit shown in FIGS. 1 and 2.

It can be seen from a timing diagram of FIG. 3:

at time t1, $CLK_S$ changes from a low level to a high level, $CLK_{H1}$ is at a high level, and $CLK_{H2}$ is at a low level; and at this time, $SW_1$ starts to be turned on, $SW_2$ is turned on, and $SW_3$ is turned off, and during a time period of t1 to t2, states of $SW_1$, $SW_2$, and $SW_3$ remain unchanged, and the circuit operates at a sampling phase. Feedback may make an input voltage $V_I$ of an ideal OPA maintain at a common mode voltage, and let the common mode voltage of the OPA be $V_{CM}$ and the input signal of readout circuit 100 be $V_{IN1}$ during the time period t1 to t2, charges stored on the input capacitor $C_1$ satisfy: $(V_{IN1}-V_{CM})*C_1$, and charges stored on the feedback capacitor $C_2$ satisfy. $(V_{REF}-V_{CM})*C_2$, where $V_{REF}$ is a voltage of a voltage source.

Then, during a time period of t2 to t3, $CLK_S$ changes from a high level to a low level, $CLK_{H1}$ changes from a high level to a low level, and $CLK_{H2}$ changes from a low level to a high level, and therefore at time t3, $SW_1$ is turned off, $SW_2$ is turned off, $SW_3$ starts to be turned on, and during a time period of t3 to t4, states of $SW_1$, $SW_2$, and $SW_3$ remain unchanged, and the circuit operates at a holding phase. Feedback may make the input voltage $V_I$ of the ideal OPA maintain at the common mode voltage $V_{CM}$, and let the input signal of readout circuit 100 be $V_{IN2}$ during the time period of t3 to t4, charges stored on the input capacitor $C_1$ may satisfy: $(V_{IN2}-V_{CM})*C_1$, and charges stored on the feedback capacitor $C_2$ may satisfy: $(V_{OUT}-V_{CM})*C_2$.

In a process of switching from the sampling phase to the holding phase, a right plate of the input capacitor $C_1$ and a left plate of the feedback capacitor $C_2$ have no charge path, and therefore according to a principle of charge conservation:

$$(V_{IN2}-V_{CM})*C_1+(V_{OUT}-V_{CM})*C_2=(V_{IN1}-V_{CM})*C_1+(V_{REF}-V_{CM})*C_2 \qquad (1)$$

It can be obtained from Equation (1):

$$V_{OUT} = V_{REF} + \frac{(V_{IN1} - V_{IN2})*C_1}{C_2} \qquad (2)$$

Finally, during a time period of t4 to t5, $CLK_{H2}$ changes from a high level to a low level, $CLK_{H1}$ changes from a low level to a high level, and $CLK_S$ changes from a low level to a high level, and therefore at time t5, $SW_1$ starts to be turned on, $SW_2$ is turned on, $SW_3$ is turned off, and the readout circuit returns to the state at time t1.

It should be noted that the foregoing sampling phase, holding phase, sampling switch, holding switch, or the like are only used to distinguish different states and different switches, and they may also be referred to as a phase 1, a phase 2, a switch 1, a switch 2, or the like.

A pixel circuit 1 may output a signal voltage $V_{sig1}$ during the time period of t1 to t2 and a reset voltage $V_{rst1}$ during the time period of t3 to t4, and an output of the pixel circuit 1 is used as an input of the readout circuit, the readout circuit may read out a photoelectric signal in the pixel circuit 1 as follows:

$$V_{OUT} = V_{REF} + \frac{(V_{sig1} - V_{rst1})*C_1}{C_2} \qquad (3)$$

Alternatively, the pixel circuit 1 may output a reset voltage $V_{rst1}$ during the time period of t1 to t2, and a signal voltage $V_{sig1}$ during the time period of t3 to t4, and an output of the pixel circuit 1 is used as an input of the readout circuit, the readout circuit may read out a photoelectric signal in the pixel circuit 1:

$$V_{OUT} = V_{REF} - \frac{(V_{sig1} - V_{rst1})*C_1}{C_2} \qquad (4)$$

where $(V_{sig1}-V_{rst1})$ is an effective photoelectric signal of the pixel circuit 1. It can be seen from Equations (3) and (4) that a gain of the readout circuit may be changed by adjusting a ratio of the input capacitor $C_1$ to the feedback capacitor $C_2$.

As described above, during the time period of t1 to t5, the readout circuit 100 may read out the effective photoelectric signal of the pixel circuit 1, and during a time period of t5 to t6, the readout circuit 100 may repeat operations of the time period of t1 to t5, and may read out an effective photoelectric signal of a pixel circuit 2. In this way, the readout circuit 100 may continuously read out effective photoelectric signals of the pixel circuit 1 to the pixel circuit n.

The photoelectric signal of the pixel circuit 1 to the pixel circuit n may be read out by the readout circuit as:

$$V_{OUT} = V_{REF} + \frac{(V_{sign} - V_{rstn}) * C_1}{C_2} \quad (5)$$

or $$V_{OUT} = V_{REF} - \frac{(V_{sign} - V_{rstn}) * C_1}{C_2} \quad (6)$$

where n is an integer and n=1, 2, 3 . . . n.

However, the readout circuit 100 shown in FIG. 2 may only continuously read out the effective photoelectric signals of one row (or one column) of pixels. In an image sensor, there are generally m*n pixel circuits, and control of the pixel circuits is generally carried out row-by-row or column-by-column; and let m be the number of rows and n be the number of columns, one image sensor needs m (or n) of the foregoing readout circuits. For the image sensor, it is a huge overhead in terms of the area and power consumption.

In light of this, an embodiment of the present application provides a readout circuit, which could reduce an area and power consumption of an image sensor.

Figure 4:
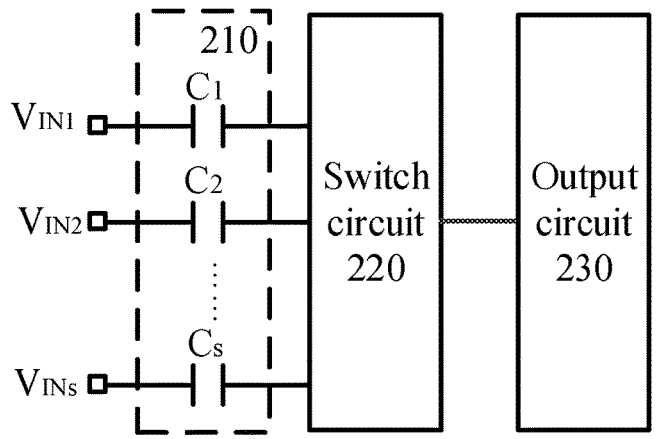
FIG. 4 is a schematic diagram of a readout circuit according to an embodiment of the present application.

FIG. 4 shows a schematic diagram of a readout circuit 200 according to an embodiment of the present application. As shown in FIG. 4, the readout circuit 200 may include a plurality of capacitors 210, a switch circuit 220, and an output circuit 230. The plurality of capacitors 210 are connected to the output circuit 230 through the switch circuit 220, the plurality of capacitors 210 are configured to store output signals of a plurality of pixel circuits, respectively, and the output circuit 230 is configured to output signals stored by the plurality of capacitors 210 through the switch circuit 220 one-by-one.

In an embodiment of the present application, a readout circuit includes a plurality of (for example, S) capacitors, so that output signals of S pixel circuits may be independently stored and then be output one-by-one, and the pixel circuits of S row (or S column) may share one readout circuit; in this way, the number of readout circuits in an image sensor could be reduced to 1/S of the original value. Due to a small size of the capacitor in the readout circuit, an increased area in the readout circuit after adding the capacitor could be ignored. In addition, power consumption of the readout circuit mainly comes from an output circuit, and power consumption of the readout circuit is almost unchanged after the capacitor is added, so that an area and power consumption of the image sensor could be reduced to 1/S of the original values.

It should be understood that the readout circuit of the embodiment of the present application may be applied to the field of integrated circuits. Optionally, the readout circuit of the embodiment of the present application may be applied to an image sensor. For example, the image sensor may be an optical fingerprint sensor. The image sensor may also be referred to as an image sensor chip or other names, and the optical fingerprint sensor may also be referred to as a fingerprint sensor, a light sensor, and a fingerprint sensor chip.

It should also be understood that the readout circuit of the embodiment of the present application has no special requirements on the pixel circuit and also has no special requirements on a structure of the operational amplifier, which may be, for example, a double-ended input operational amplifier, a rail-to-rail operational amplifier, a fully differential operational amplifier, or the like. Therefore, the readout circuit of the embodiment of the present application may be widely applied to the design of an existing image sensor.

In an embodiment of the present application, the plurality of pixel circuits may be pixel circuits in a same direction. The pixel circuits in the same direction herein may be pixel circuits in a same row or pixel circuits in a same column.

Optionally, the number of the plurality of capacitors 210 may be less than or equal to the number of the plurality of pixel circuits. For example, in an image sensor, there are m*n pixel circuits, and if the pixel circuits mentioned above are pixel circuits in a same column, the number of the plurality of capacitors 210 may be less than or equal to m; and if the plurality of pixel circuits mentioned above are pixel circuits in a same row, the number of the plurality of capacitors 210 may be less than or equal to n.

Preferably, the number of the plurality of capacitors 210 is equal to the number of pixel circuits in the same direction. At this time, the number of readout circuits required in the image sensor is the smallest, and the area and power consumption of the image sensor are the smallest.

Optionally, in some embodiments, the plurality of capacitors 210 may simultaneously sample and store the output signals of the plurality of pixel circuits.

For example, if the image sensor has 10*5 pixel circuits and the plurality of pixel circuits in the embodiment of the present application are pixel circuits in the same column, the plurality of capacitors 210 may simultaneously store output signals of 10 pixel circuits in the first column, and then the output circuit outputs the output signals of the 10 pixel circuits one-by-one. Next the plurality of capacitors 210 simultaneously store output signals of 10 pixel circuits in the second column, and then the output circuit outputs the output signals of the 10 pixel circuits in the second column one-by-one. By analogy, the plurality of capacitors 210 may simultaneously store output signals of 10 pixel circuits in the fifth column, and then the output circuit outputs the output signals of the 10 pixel circuits in the fifth column one-by-one.

When the plurality of capacitors 210 simultaneously sample the output signals of the plurality of pixel circuits, all switches in the switch circuit 220 in the embodiment of the present application are turned on.

In this implementation, the number of readout circuits may be reduced without changing the control manner of the pixel circuit, thereby reducing the area and power consumption of the image sensor.

Optionally, in other embodiments, the plurality of capacitors 210 may not simultaneously sample and store the output signals of the plurality of pixel circuits. For example, the plurality of capacitors 210 sequentially sample and store the output signals of the plurality of pixel circuits; alternatively, the plurality of capacitors 210 may be divided into a plurality of groups, the capacitors in each group sample and store the output signals of the pixel circuits at the same time, but the capacitors in different groups sample and store the output signals of the pixel circuits at different time.

Optionally, in some embodiments, the output circuit 230 may be configured to amplify the signals stored by the plurality of capacitors 210 and output the amplified signals, and provide driving capability to the output signals. The embodiment of the present application does not limit an amplification factor of the amplified signal of the output circuit 230, for example, the amplification factor may be less than 1, equal to 1, or greater than 1.

In the embodiment of the present application, the output circuit 230 includes an operational amplifier, a feedback capacitor, a first switch, a second switch, and a third switch. Two ends of the first switch may be connected to an input end and an output end of the operational amplifier, respectively, a left plate of the feedback capacitor may be connected to the input end of the operational amplifier, a right plate of the feedback capacitor may be connected to the output end of the operational amplifier through the third switch, and two ends of the second switch may be connected to the right plate of the feedback capacitor and a voltage source, respectively.

The first switch may also be referred to as a sampling switch, and the second switch and the third switch may also be referred to as a holding switch, respectively. Illustratively, the operational amplifier, the feedback capacitor, the first switch, the second switch, and the third switch may correspond to OPA, $C_2$, $SW_1$, $SW_2$, and $SW_3$ in FIG. 2, respectively.

It should be understood that in the embodiment of the present application, "first", "second" and "third" are merely used to distinguish different objects, and are not intended to limit the scope of the embodiment of the present application.

Optionally, in some embodiments, the switch circuit 220 may include only one switch, which may have a plurality of contacts. The number of contacts of the switch may be the same as the number of the plurality of pixel circuits.

In this embodiment, when the output circuit 230 outputs a signal stored by an i-th capacitor of the plurality of capacitors 210, a switch in the switch circuit 220 may be switched to be connected to the i-th capacitor, to output the signal stored by the i-th capacitor.

Optionally, in other embodiments, the switch circuit 220 may include a plurality of switches that are in one-to-one correspondence with the plurality of capacitors 210. At this time, the output circuit 230 may be configured to output the signals stored by the plurality of capacitors 210 one-by-one through sequential turn-on of the plurality of switches.

In this embodiment, when the output circuit 230 outputs the signal stored by the i-th capacitor of the plurality of capacitors 210, the switch corresponding to the i-th capacitor is turned on, and the remaining switches, that is, other switches in the switch circuit 220 except the switch corresponding to the i-th capacitor are turned off.

At this time, the switch circuit 220 and the plurality of capacitors 210 may integrally form an input capacitor array. In this embodiment, a schematic structural diagram of one possible readout circuit 2100 of the readout circuit 200 may be shown in FIG. 5. It can be seen that the readout circuit 2100 may mainly include the following parts:

(a) an input capacitor array, where the input capacitor array may include a capacitor group 11 to a capacitor group 1S, the capacitor group 11 includes an input capacitor $C_1$ and a switch $SW_1$, the capacitor group 12 includes an input capacitor $C_2$ and a switch $SW_2$, . . . , and the capacitor group 1S includes an input capacitor $C_S$ and a switch $SW_S$. Capacitances of the input capacitor $C_1$, the input capacitor $C_2$ . . . , and the input capacitor $C_S$ are $C_1$, $C_2$ . . . $C_S$, respectively. A control signal of the switch $SW_1$ is $CLK_{P1}$, a control signal of the switch $SW_2$ is $CLK_{P2}$ . . . , and a control signal of the switch $SW_S$ is $CLK_{PS}$; and (b) an output circuit, where the output circuit may include a feedback capacitor $C_F$, an operational amplifier, a first switch $SW_{S+1}$, a second switch $SW_{S+2}$, and a third switch $SW_{S+3}$. A capacitance of the feedback capacitor $C_F$ is $C_F$. A gain of the operational amplifier is $-A$, ideally A is $\infty$, an input voltage of the operational amplifier is $V_I$, and an output voltage thereof is $V_{OUT}$. A control signal of the first switch $SW_{S+1}$ is $CLK_S$, a control signal of the second switch $SW_{S+2}$ is $CLK_{H1}$, and a control signal of the third switch $SW_{S+3}$ is $CLK_{H2}$.

Figure 6:
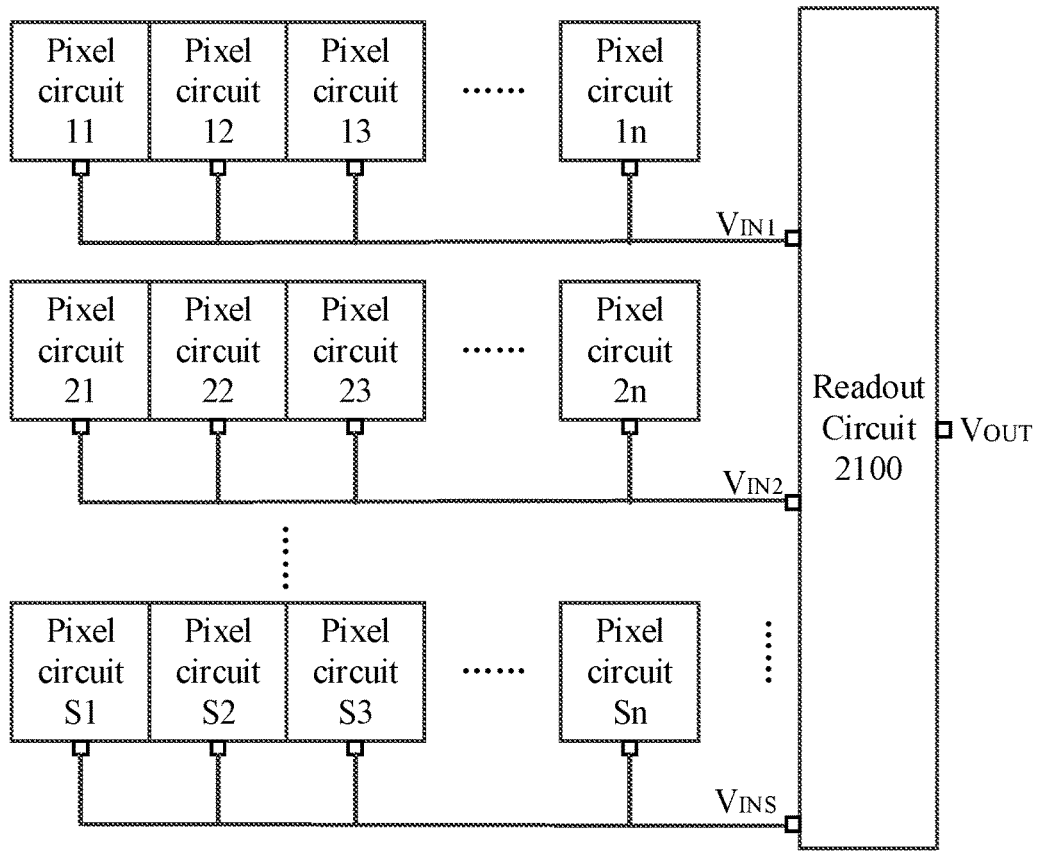
FIG. 6 is a schematic diagram of an application manner of the readout circuit shown in FIG. 5.

FIG. 6 is a schematic diagram of one possible application manner of the readout circuit 2100. As shown in FIG. 6, an image sensor includes S*n pixel circuits, and the number of a plurality of capacitors 210 is the same as the number of pixel circuits in a same column, and therefore one image sensor may only need one readout circuit.

Figure 5:
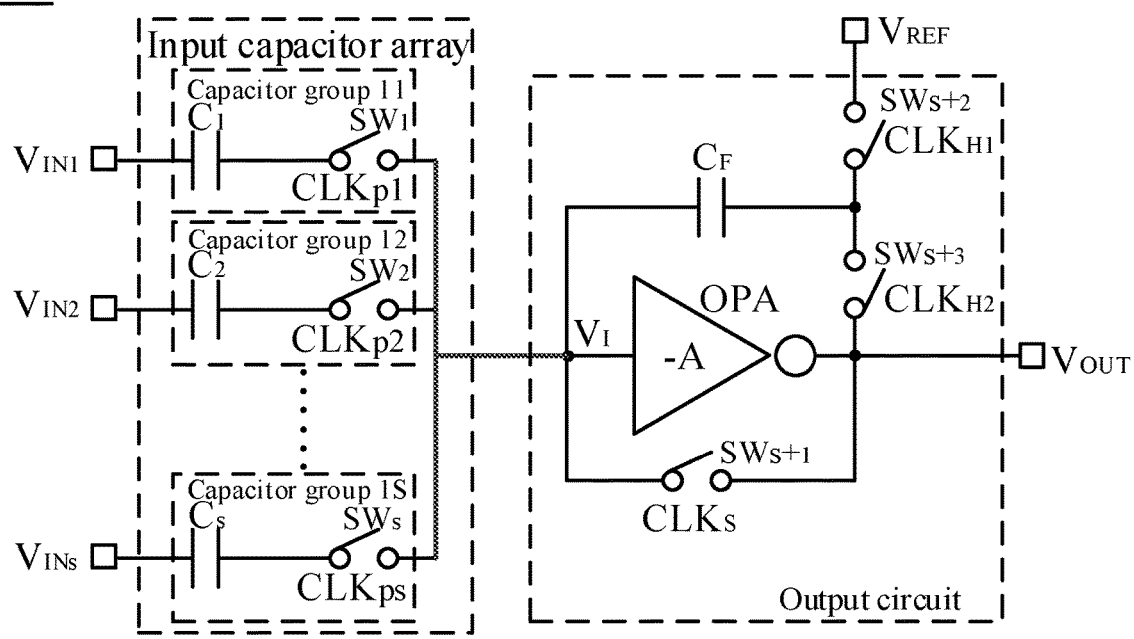
FIG. 5 is a schematic structural diagram of a readout circuit according to an embodiment of the present application.
Figure 7:
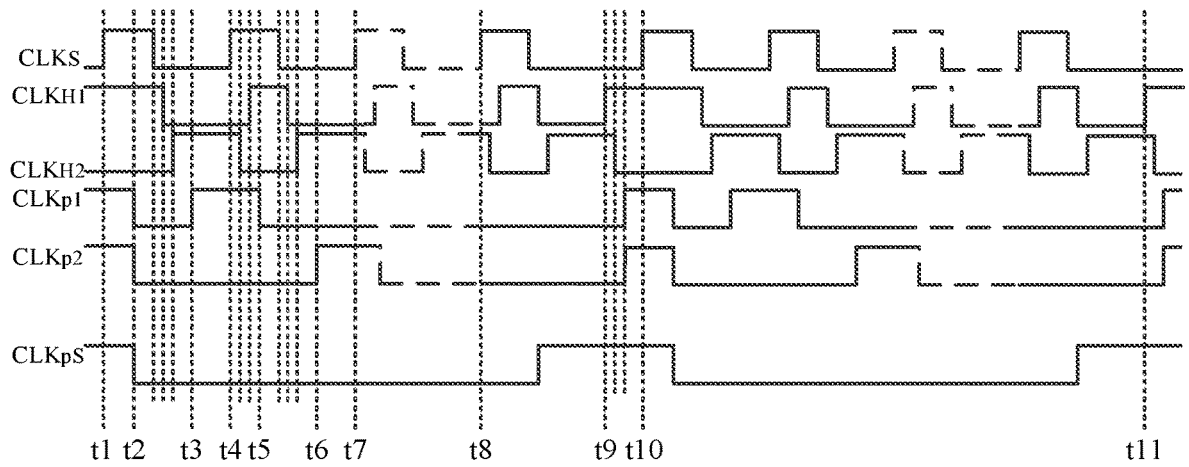
FIG. 7 is a timing diagram of a control manner corresponding to the readout circuit shown in FIGS. 5 and 6.

FIG. 7 is a timing diagram of a control manner corresponding to the readout circuit 2100 shown in FIGS. 5 and 6. A working principle of the readout circuit 2100 will be described below with reference to FIG. 6. For ease of description, all of the foregoing switches are all defined as: conducting when the control signal is at a high level.

First, at time t1, $CLK_S$ changes from a low level to a high level, $CLK_{H1}$ is at a high level, $CLK_{H2}$ is at a low level, and $CLK_{P1}$ to $CLK_{PS}$ are all at high levels. At this time, $SW_{S+1}$ starts to be turned on, $SW_{S+2}$ is turned on, $SW_{S+3}$ is turned off, $SW_1$ to $SW_S$ are all turned on, and during a time period of t1 to t2, states of all the switches remain unchanged and the readout circuit 2100 operates at a sampling phase. Feedback may make an input voltage $V_I$ of an ideal OPA maintain at a common mode voltage.

Let the common mode voltage of the operational amplifier be $V_{CM}$ and input voltages of the readout circuit 2100 during the time period of t1 to t2 be $V_{IN11}$ to $V_{INS1}$, respectively, charges stored on input capacitors $C_1$ to $C_S$ satisfy: $(V_{IN11}-V_{CM})*C_1$ to $(V_{INS1}-V_{CM})*C_S$, respectively, and charges stored on feedback capacitor $C_F$ satisfy: $(V_{REF}-V_{CM})*C_F$, where $V_{REF}$ is a voltage of a voltage source.

Then, during a time period of t2 to t3, at first $CLK_{P1}$ to $CLK_{PS}$ simultaneously change from high levels to low levels, then $CLK_S$ changes from a high level to a low level, $CLK_{H1}$ changes from a high level to a low level, $CLK_{H2}$ changes from a low level to a high level, and finally $CLK_{P1}$ changes from a low level to a high level. Therefore, at time t3, $SW_{S+1}$ is turned off, $SW_{S+2}$ is turned off, $SW_{S+3}$ is turned on, $SW_1$ starts to be turned on, the remaining switches are turned off, and during a time period of t3 to t4, states of all the switches remain unchanged and the circuit operates at a holding phase 1.

Feedback may make the input voltage $V_I$ of the ideal operational amplifier maintain at the common mode voltage $V_{CM}$, and let an input signal of a left plate of $C_1$ be $V_{IN12}$ during the time period of t3 to t4, charges stored on the input capacitor $C_1$ satisfy: $(V_{IN12}-V_{CM})*C_1$, and charges stored on the feedback capacitor $C_F$ satisfy: $(V_{OUT}-V_{CM})*C_F$.

In a process of switching from the sampling phase to the holding phase 1, a right plate of the input capacitor $C_1$ and a left plate of the feedback capacitor $C_F$ have no charge path, and therefore according to a principle of charge conservation:

$$(V_{IN12}-V_{CM})*C_1(V_{OUT}-V_{CM})*C_F(V_{IN11}-V_{CM})*C_1+ (V_{REF}-V_{CM})*C_F \qquad (7)$$

It can be obtained from Equation (7):

$$V_{OUT} = V_{REF} + \frac{(V_{IN11}-V_{IN12})*C_1}{C_F} \qquad (8)$$

Then, during a time period of t4 to t5, $CLK_S$ changes from a low level to a high level, $CLK_{H2}$ changes from a high level to a low level, $CLK_{H1}$ changes from a low level to a high level, and $CLK_{P1}$ changes from a high level to a low level, and therefore at time t5, $SW_{S+1}$ is turned on, $SW_{S+2}$ is turned on, $SW_{S+3}$ is turned off, $SW_1$ starts to be turned off, the readout circuit 2100 returns to the state at time t2, and charges on the feedback capacitor $C_F$ changes to $(V_{REF}-V_{CM})*C_F$ again.

Then, during a time period of t5 to t6, $CLK_{P1}$ changes from a high level to a low level, $CLK_S$ changes from a high level to a low level, $CLK_{H1}$ changes from a high level to a low level, $CLK_{H2}$ changes from a low level to a high level, and $CLK_{P2}$ changes from a low level to a high level. Therefore, at time t6, $SW_{S+1}$ is turned off, $SW_{S+2}$ is turned off, $SW_{S+3}$ is turned on, $SW_2$ starts to be turned on, the remaining switches are turned off, and during a time period of t6 to t7, states of the switches remain unchanged and the circuit operates at a holding phase 2. Feedback may make the input voltage $V_I$ of the ideal OPA maintain at the common mode voltage $V_{CM}$. Let an input signal of a left plate of the input capacitor $C_2$ be $V_{IN22}$ during the time period of t6 to t7, charges stored on the input capacitor $C_2$ satisfy $(V_{IN22}-V_{CM})*C_2$, and charges stored on the feedback capacitor $C_F$ satisfy: $(V_{OUT}-V_{CM})*C_F$.

In a process of switching from the sampling phase to the holding phase 2, a right plate of the input capacitor $C_2$ has no charge path, and a left plate of the feedback capacitor $C_F$ has no charge path, and therefore according to a principle of charge conservation:

$$(V_{IN22}-V_{CM})*C_2+(V_{OUT}-V_{CM})*C_F= (V_{IN21}-V_{CM})*C_2+(V_{REF}-V_{CM})*C_F \quad (9)$$

It may be derived:

$$V_{OUT} = V_{REF} + \frac{(V_{IN21} - V_{IN22})*C_2}{C_F} \quad (10)$$

Then, during a time period of t7 to t9, the readout circuit may continuously perform operations similar to the time period of t4 to t7 for S−2 times, and it may be obtained:

$$V_{OUT} = V_{REF} + \frac{(V_{INS1} - V_{INS2})*C_S}{C_F} \quad (11)$$

Finally, during a time period of t9 to t10, $CLK_{H1}$ changes from a low level to a high level, $CLK_{H2}$ changes from a high level to a low level, $CLK_{P1}$ to $CLK_{P(S-1)}$ changes from low levels to high levels, and $CLK_S$ changes from a low level to a high level, and therefore at time t10, $SW_{S+1}$ starts to be turned on, $SW_{S+2}$ is turned on, $SW_{S+3}$ is turned off, $SW_1$ to $SW_S$ are all turned on, and the readout circuit returns to the state at time t1.

A pixel circuit 11 to a pixel circuit $S_1$ may respectively output signal voltages $V_{sig11}$ to $V_{sigS1}$ during the time period of t1 to t2, and the pixel circuit 11 may output a reset voltage $V_{rst11}$ during the time period of t3 to t4, and an output of the pixel circuit 11 is used as an input of the readout circuit 2100, the readout circuit 2100 may read out a photoelectric signal in the pixel circuit 11.

$$V_{OUT} = V_{REF} + \frac{(V_{sig11} - V_{rst11})*C_1}{C_F} \quad (12)$$

Alternatively, a pixel circuit 11 to a pixel circuit S1 may respectively output reset voltages $V_{rst11}$ to $V_{rstS1}$ during the time period of t1 to t2, and the pixel circuit 11 may output a signal voltage $V_{sig11}$ during the time period of t3 to t4, and an output of the pixel circuit 11 is used as an input of the readout circuit 2100, the readout circuit 2100 may read out a photoelectric signal in the pixel circuit 11:

$$V_{OUT} = V_{REF} - \frac{(V_{sig11} - V_{rst11})*C_1}{C_F} \quad (13)$$

where $(V_{sig11}-V_{rst11})$ is an effective photoelectric signal of the pixel circuit 11. It can be seen from Equations (12) and (13) that a gain of the readout circuit 2100 may be changed by adjusting a ratio of the input capacitor $C_1$ to the feedback capacitor $C_F$.

Similar to the pixel circuit 11, during the time period of t6 to t7, if a pixel circuit 21 outputs a reset voltage $V_{rst21}$ (or a signal voltage $V_{sig21}$), an output of the pixel circuit 21 is used as an input of the readout circuit 2100, the readout circuit 2100 may read out a photoelectric signal in the pixel circuit 21:

$$V_{OUT} = V_{REF} + \frac{(V_{sig21} - V_{rst21})*C_1}{C_F} \quad (14)$$

or $$V_{OUT} = V_{REF} - \frac{(V_{sig21} - V_{rst21})*C_1}{C_F} \quad (15)$$

Similarly, during the time period of t8 to t9, the readout circuit 2100 may read out a photoelectric signal in a pixel circuit S1:

$$V_{OUT} = V_{REF} + \frac{(V_{sigS1} - V_{rstS1})*C_1}{C_F} \quad (16)$$

or $$V_{OUT} = V_{REF} - \frac{(V_{sigS1} - V_{rstS1})*C_1}{C_F} \quad (17)$$

As described above, during the time period of t1 to t10, the readout circuit 2100 continuously reads out the effective photoelectric signals of the pixel circuit 11 to the pixel circuit S1 (for example, the pixel circuit of the first column of the image sensor), and during a time period of t10 to t11, the readout circuit 2100 repeats the operations of the time period of t1 to t10 and may continuously read out effective photoelectric signals of pixel circuits of the second column of the image sensor, that is, a pixel circuit 12 to a pixel circuit S2. In this way, the readout circuit 2100 may continuously read out the effective photoelectric signals of the pixel circuit 11 to the pixel circuit Sn. It may be obtained:

$$V_{OUT} = V_{REF} + \frac{(V_{sigSn} - V_{rstSn})*C_1}{C_F} \quad (18)$$

or $$V_{OUT} = V_{REF} - \frac{(V_{sigSn} - V_{rstSn})*C_1}{C_F} \quad (19)$$

where n is an integer and $1 \leq n \leq S$.

It should be noted that the sampling phase, the holding phase 1 and the holding phase 2 of the readout circuit 2100 are only used to distinguish different phase states, are not intended to limit the scope of this embodiment of the present application, and they may also be referred to as a phase 1, a phase 2, a phase 3, or the like.

The readout circuit of the embodiment of the present application may be used simultaneously with an existing image sensor technology, and there is no limitation on the image sensor technology, for example, the image sensor technology may be a multi-pixel averaging technology or the like.

Figure 8:
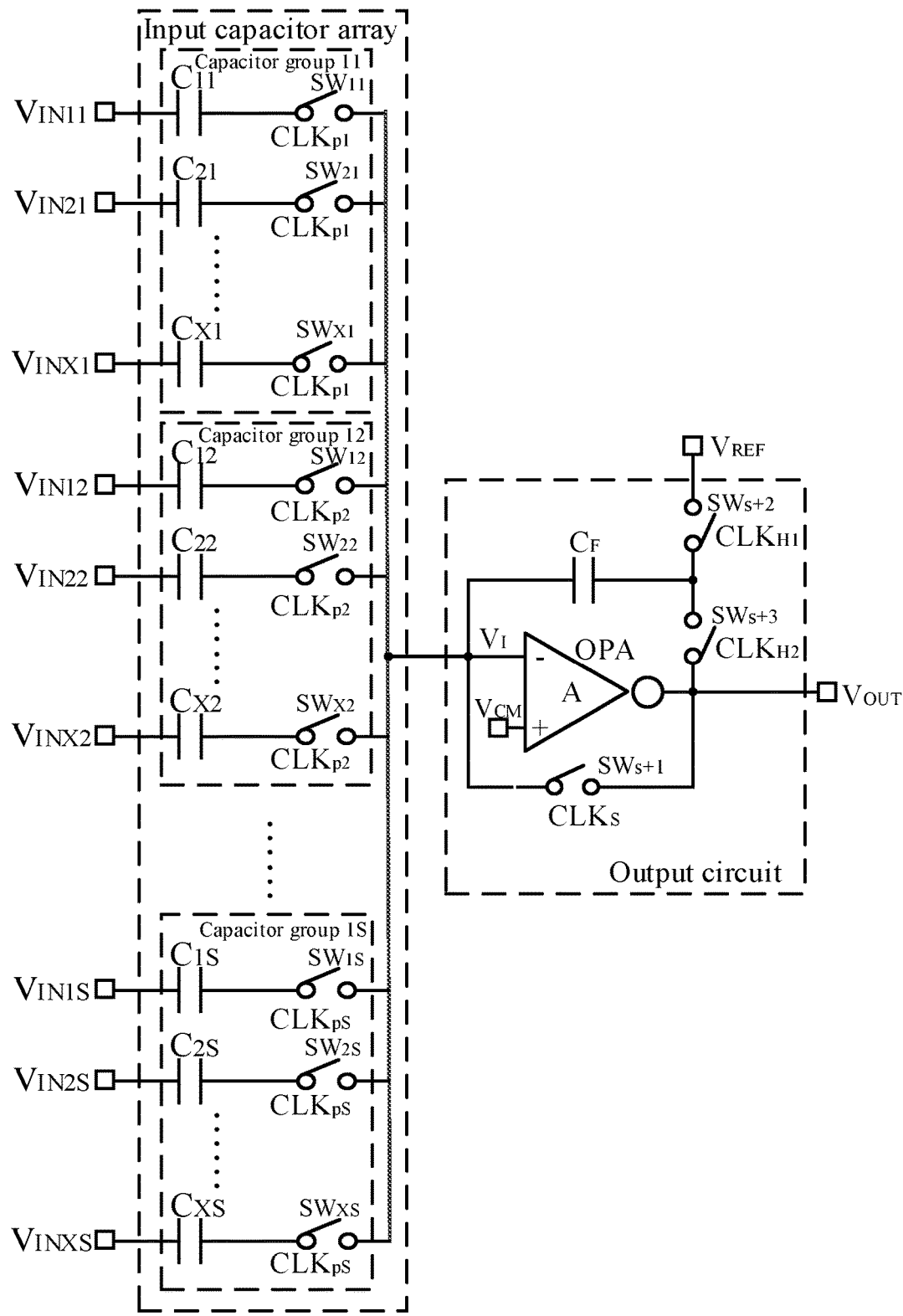
FIG. 8 is a schematic structural diagram of another readout circuit according to an embodiment of the present application.

FIG. 8 is a schematic structural diagram of one possible readout circuit 2200 according to an embodiment of the present application. The readout circuit 2200 incorporates a pixel averaging technology, and an operational amplifier in an output circuit is a double-ended input operational amplifier.

Figure 9:
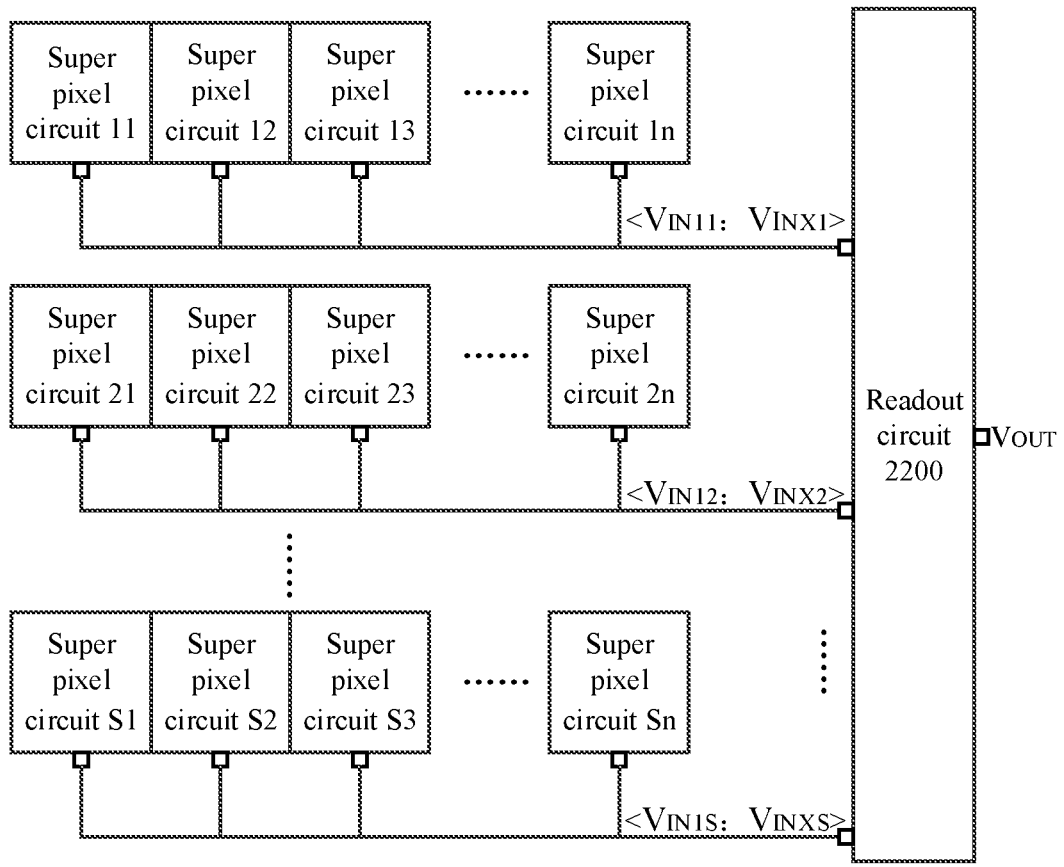
FIG. 9 is a schematic diagram of an application manner of the readout circuit shown in FIG. 8.
Figure 10:
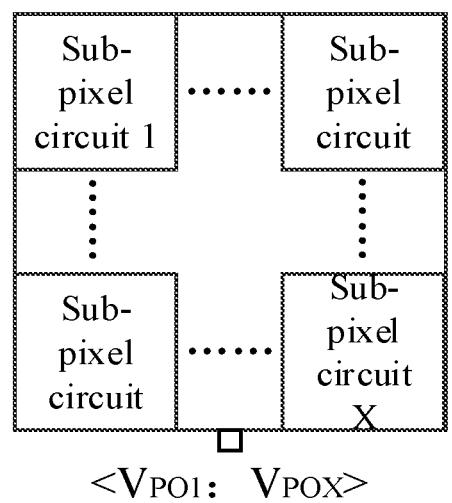
FIG. 10 is a schematic structural diagram of a super pixel circuit according to an embodiment of the present application.

FIG. 9 is a schematic diagram of one possible application manner of the readout circuit 2200. Pixel circuits in FIG. 9 are super pixel circuits, and a structural schematic diagram of the super pixel circuits may refer to FIG. 10. It can be seen from FIG. 10 that one super pixel circuit may include a plurality of sub-pixel circuits, and the one super pixel circuit may have X output signals $V_{PO1}$ to $V_{POX}$, where $V_{PO1}$ is an output signal of a sub-pixel circuit 1 and $V_{POX}$ is an output signal of a sub-pixel X.

It can be seen from FIG. 8 that the readout circuit 2200 may mainly include the following parts:

(a) an input capacitor array, where the input capacitor array may include a capacitor group 11 to a capacitor group 1S, the capacitor group 11 includes input capacitors $C_{11}$ to $C_{X1}$ and switches $SW_{11}$ to $SW_{X1}$, and capacitances of the input capacitors $C_{11}$ to $C_{X1}$ are $C_{11}$ to $C_{X1}$, respectively; a capacitor group 12 includes input capacitors $C_{12}$ to $C_{X2}$ and switches $SW_{12}$ to $SW_{X2}$, capacitances of the input capacitors $C_{12}$ to $C_{X2}$ are $C_{12}$ to $C_{X2}$, respectively; . . . and a capacitor group 1S includes input capacitors $C_{1S}$ to $C_{XS}$ and switches $SW_{1S}$ to $SW_{XS}$, and capacitances of the input capacitors $C_{1S}$ to $C_{XS}$ are $C_{1S}$ to $C_{XS}$, respectively. A control signal of the switches $SW_{11}$ to $SW_{X1}$ of the capacitor group 11 is $CLK_{P1}$, a control signal of the switches $SW_{12}$ to $SW_{X2}$ of the capacitor group 12 is $CLK_{P2}$ . . . , and a control signal of the switches $SW_{1S}$ to $SW_{XS}$ of the capacitor group 1S is $CLK_{PS}$.

Optionally, the number of capacitors included in each capacitor group may be the same as the number of sub-pixel circuits in each super pixel circuit. For example, each super pixel circuit includes X sub-pixel circuits, and each capacitor group includes X capacitors and switches corresponding to the X capacitors.

It can be seen that in FIG. 8, the plurality of capacitors and the switch circuits integrally form an input capacitor array.

(b) an output circuit, where the output circuit may include a feedback capacitor $C_F$, an operational amplifier, a first switch $SW_{S+1}$, a second switch $SW_{S+2}$, and a third switch $SW_{S+3}$. A capacitance of the feedback capacitor $C_F$ is $C_F$. A gain of the operational amplifier is $-A$, ideally A is $\infty$, a negative phase input voltage of the operational amplifier is $V_I$, an output voltage is $V_{OUT}$, and a positive phase input voltage is $V_{CM}$. A control signal of the first switch $SW_{S+1}$ is $CLK_S$, a control signal of the second switch $SW_{S+2}$ is $CLK_{H1}$, and a control signal of the third switch $SW_{S+3}$ is $CLK_{H2}$.

A working principle of the readout circuit 2200 will be described below with reference to FIG. 7. For ease of description, all switches in FIG. 8 are defined as: conducting when the control signal is at a high level.

First, at time t1, $CLK_S$ changes from a low level to a high level, $CLK_{H1}$ is at a high level, $CLK_{H2}$ is at a low level, and $CLK_{P1}$ to $CLK_{PS}$ are all at high levels. Therefore, $SW_{S+1}$ starts to be turned on, $SW_{S+2}$ is turned on, $SW_{S+3}$ is turned off, $SW_{11}$ to $SW_{XS}$ are all turned on, and during a time period of t1 to t2, states of all the switches remain unchanged and the circuit operates at a sampling phase.

Feedback may make a negative phase input voltage $V_I$ of the ideal operational amplifier be equal to a positive phase input voltage $V_{CM}$. Let input voltages of the readout circuit 2200 be $V_{IN111}$ to $V_{INXS1}$ during the time period of t1 to t2, charges stored on input capacitors $C_{11}$ to $C_{XS}$ are $(V_{IN111}-V_{CM})*C_{11}$ to $(V_{INXS1}-V_{CM})*C_{XS}$, respectively, and charges stored on a feedback capacitor $C_F$ satisfy: $(V_{REF}-V_{CM})*C_F$.

Then, during a time period of t2 to t3, at first $CLK_{P1}$ to $CLK_{PS}$ simultaneously change from high levels to low levels, then $CLK_S$ changes from a high level to a low level, $CLK_{H1}$ changes from a high level to a low level, $CLK_{H2}$ changes from a low level to a high level, and finally $CLK_{P1}$ changes from a low level to a high level. Therefore, at time t3, $SW_{S+1}$ is turned off, $SW_{S+2}$ is turned off, $SW_{S+3}$ is turned on, $SW_{11}$ to $SW_{X11}$ start to be turned on, the remaining switches are turned off, and during a time period of t3 to t4, states of all the switches remain unchanged and the circuit operates at a holding phase 1.

Feedback may make the negative phase input voltage $V_I$ of the ideal operational amplifier be equal to the positive phase input voltage $V_{CM}$. Let input signals of left plates of the input capacitors $C_{11}$ to $C_{X1}$ are $V_{IN112}$ to $V_{INX12}$ during the time period of t3 to t4, charges stored on the input capacitors $C_{11}$ to $C_{X1}$ are $(V_{IN111}-V_{CM})*C_{11}$ to $(V_{INXS1}-V_{CM})*C_{XS}$, respectively, and charges stored on the feedback capacitor $C_F$ are $(V_{REF}-V_{CM})*C_F$.

In a process of switching from the sampling phase to the holding phase 1, right plates of the input capacitors $C_{11}$ to $C_{X1}$ and a left plate of the feedback capacitor $C_F$ have no charge path, and therefore according to a principle of charge conservation:

$$\Sigma_{m=1}^{m=X}(V_{INm12}-V_{CM})*C_{m1}+ \\ (V_{OUT}-V_{CM})*C_F=\Sigma_{m=1}^{m=X}(V_{INm11}-V_{CM})*C_{m1}+ \\ (V_{REF}-V_{CM})*C_F \quad (20)$$

It may be derived:

$$V_{OUT}=V_{REF}+\frac{\sum_{m=1}^{m=X}(V_{INm11}-V_{INm12})*C_{m1}}{C_F} \quad (21)$$

Then, during a time period of t4 to t5, $CLK_S$ changes from a low level to a high level, $CLK_{H2}$ changes from a high level to a low level, $CLK_{H1}$ changes from a low level to a high level, and $CLK_{P1}$ changes from a high level to a low level, and therefore at time t5, $SW_{S+1}$ is turned on, $SW_{S+2}$ is turned on, $SW_{S+3}$ is turned off, $SW_{11}$ to $SW_{X1}$ start to be turned off, the readout circuit returns to the state at time t2, and charges on the feedback capacitor $C_F$ changes to $(V_{REF}-V_{CM})*C_F$ again.

Then, during a time period of t5 to t6, $CLK_{P1}$ changes from a high level to a low level, $CLK_S$ changes from a high level to a low level, $CLK_{H1}$ changes from a high level to a low level, $CLK_{H2}$ changes from a low level to a high level, and $CLK_{P2}$ changes from a low level to a high level. Therefore, at time t6, $SW_{S+1}$ is turned off, $SW_{S+2}$ is turned off, $SW_{S+3}$ is turned on, $SW_{12}$ to $SW_{X2}$ start to be turned on, the remaining switches are turned off, and during a time period of t6 to t7, states of the switches remain unchanged and the circuit operates at a holding phase 2.

Feedback may make the negative phase input voltage $V_I$ of the ideal OPA be equal to the positive phase input voltage $V_{CM}$. Let input signals of left plates of input capacitors $C_{12}$ to $C_{X2}$ are $V_{IN122}$ to $V_{INX22}$ during the time period of t6 to t7, charges stored on the input capacitors $C_{12}$ to $C_{X2}$ are $(V_{IN122}-V_{CM})*C_{12}$ to $(V_{INX22}-V_{CM})*C_{X2}$, respectively, and charges stored on the feedback capacitor $C_F$ are $(V_{OUT}-V_{CM})*C_F$.

In a process of switching from the sampling phase to the holding phase 2, right plates of the input capacitors $C_{12}$ to $C_{X2}$ have no charge path, and a left plate of the feedback capacitor $C_F$ has no charge path, and therefore according to a principle of charge conservation:

$$\Sigma_{m=1}^{m=X}(V_{INm22}-V_{CM})*C_{m2}+ (V_{OUT}-V_{CM})*C_F = \Sigma_{m=1}^{m=X}(V_{INm21}-V_{CM})*C_{m2}+ (V_{REF}-V_{CM})*C_F \quad (22)$$

It may be derived:

$$V_{OUT} = V_{REF} + \frac{\sum_{m=1}^{m=X}(V_{INm21}-V_{INm22})*C_{m2}}{C_F} \quad (23)$$

Then, during a time period of t7 to t9, the readout circuit may continuously perform operations similar to the time period of t4 to t7 for S−2 times, and it may be obtained:

$$V_{OUT} = V_{REF} + \frac{\sum_{m=1}^{m=X}(V_{INmS1}-V_{INmS2})*C_{mS}}{C_F} \quad (24)$$

Finally, during the time period of t9 to t10, $CLK_{H1}$ changes from a low level to a high level, $CLK_{H2}$ changes from a high level to a low level, $CLK_{P1}$ to $CLK_{P(S-1)}$ all change from low levels to high levels, and $CLK_S$ changes from a low level to a high level. Therefore, at time t10, $SW_{S+1}$ starts to be turned on, $SW_{S+2}$ is turned on, $SW_{S+3}$ is turned off, $SW_{11}$ to $SW_{XS}$ are all turned on, and the readout circuit returns to the state at time t1.

A super pixel circuit 11 to a super pixel circuit S1 may respectively output signal voltages $<V_{sig111}: V_{sigX11}>$ to $<V_{sig1S1}: V_{sigXS1}>$ during the time period of t1 to t2, and the super pixel circuit 11 may output a reset voltage $<V_{rst111}: V_{rstX11}>$ during the time period of t3 to t4, an output of the super pixel circuit 11 is used as an input of the readout circuit 2200, and the readout circuit 2200 may read out a photoelectric signal in the super pixel circuit 11:

$$V_{OUT} = V_{REF} + \frac{\sum_{m=1}^{m=X}(V_{sigm11}-V_{rstm11})*C_{m1}}{C_F} \quad (25)$$

Alternatively, during the time period of t1 to t2, a super pixel circuit 11 to a super pixel circuit S1 may respectively output reset voltages $<V_{rst111}: V_{rstX11}>$ to $<V_{rst1S1}: V_{rstXS1}>$, and during the time period of t3 to t4, the super pixel circuit 11 may output signal voltages $<V_{sig111}: V_{sigX11}>$, an output of the super pixel circuit 11 is used as an input of the readout circuit 2200, and the readout circuit 2200 may read out a photoelectric signal in the super pixel circuit 11:

$$V_{OUT} = V_{REF} - \frac{\sum_{m=1}^{m=X}(V_{sigm11}-V_{rstm11})*C_{m1}}{C_F} \quad (26)$$

where $(V_{sigm11}-V_{rstm11})$ is an effective photoelectric signal of a m-th sub-pixel circuit in the super pixel circuit 11. It can be seen from Equations (25) and (26) that a gain of the readout circuit 2200 may be changed by adjusting a capacitance ratio of the input capacitor $C_{m1}$ to the feedback capacitor $C_F$.

Similar to the super pixel circuit 11, during the time period of t6 to t7, a super pixel circuit 21 may output a reset voltage $<V_{rst121}: V_{rstX21}>$ (or a signal voltage $<V_{sig121}: V_{sigX21}>$), an output of the super pixel circuit 21 is used as an input of the readout circuit 2200, and the readout circuit 2200 may read out a photoelectric signal in the super pixel circuit 21:

$$V_{OUT} = V_{REF} + \frac{\sum_{m=1}^{m=X}(V_{sigm21}-V_{rstm21})*C_{m2}}{C_F} \quad (27)$$

or $$V_{OUT} = V_{REF} - \frac{\sum_{m=1}^{m=X}(V_{sigm21}-V_{rstm21})*C_{m2}}{C_F} \quad (28)$$

Similarly, during the time period of t8 to t9, the readout circuit 2200 may read out a photoelectric signal in a super pixel circuit S1:

$$V_{OUT} = V_{REF} + \frac{\sum_{m=1}^{m=X}(V_{sigmS1}-V_{rstmS1})*C_{mS}}{C_F} \quad (29)$$

or $$V_{OUT} = V_{REF} - \frac{\sum_{m=1}^{m=X}(V_{sigmS1}-V_{rstmS1})*C_{mS}}{C_F} \quad (30)$$

As described above, during the time period of t1 to t10, the readout circuit 2200 continuously reads out the effective photoelectric signals of the super pixel circuit 11 to the super pixel circuit S1 (that is, the super pixel circuit of the first column of the image sensor), and during a time period of t10 to t11, the readout circuit 2200 repeats the operations of the time period of t1 to t10 and may continuously read out effective photoelectric signals of super pixel circuits of the second column of the image sensor, that is, a super pixel circuit 12 to a super pixel circuit S2. In this way, the readout circuit 2200 may continuously read out the effective photoelectric signals of the super pixel circuit 11 to the super pixel circuit Sn. It may be obtained:

$$V_{OUT} = V_{REF} + \frac{\sum_{m=1}^{m=X}(V_{sigmSn} - V_{rstmSn}) * C_{mS}}{C_F} \quad (31)$$

or $$V_{OUT} = V_{REF} - \frac{\sum_{m=1}^{m=X}(V_{sigmSn} - V_{rstmSn}) * C_{mS}}{C_F} \quad (32)$$

It should be noted that the sampling phase, the holding phase 1 and the holding phase 2 of the readout circuit 2200 are only used to distinguish different phase states, are not intended to limit the scope of this embodiment of the present application, and they may also be referred to as a phase 1, a phase 2, a phase 3, or the like.

In an embodiment of the present application, a readout circuit includes a plurality of (for example, S) capacitors, so that output signals of S pixel circuits may be independently stored and then be output one-by-one, and the pixel circuits of S row (or S column) may share one readout circuit; in this way, the number of readout circuits in an image sensor could be reduced to 1/S of the original value. Due to a small size of the capacitor in the readout circuit, an increased area in the readout circuit after adding the capacitor could be ignored. In addition, power consumption of the readout circuit mainly comes from an output circuit, and power consumption of the readout circuit is almost unchanged after the capacitor is added, so that an area and power consumption of the image sensor could be reduced to 1/S of the original values.

An embodiment of the present application also provides an image sensor configured to convert a light signal into an electrical signal.

Optionally, the image sensor may include a readout circuit. The readout circuit may be the readout circuit 200 in the foregoing embodiment, and a corresponding operation of the readout circuit 200 may be realized, which is not repeatedly described herein for brevity.

It should be understood that the readout circuit of the embodiment of the present application may be applied to various electronic devices, and more particularly, to an electronic device having a display screen, for example, portable or mobile computing devices such as a smart phone, a notebook computer, a tablet computer and a game device, and other electronic devices such as an electronic database, an automobile and an automated teller machine (ATM), which is not limited in the embodiments of the present application.

Figure 11:
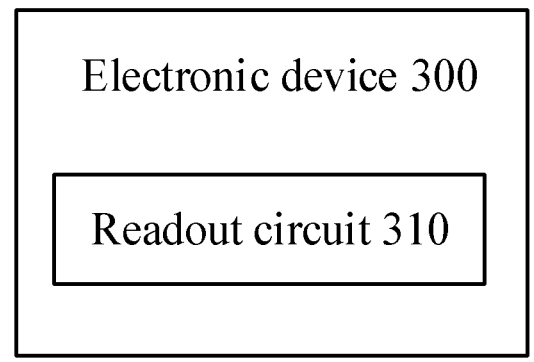
FIG. 11 is a schematic block diagram of an electronic device according to an embodiment of the present application.

An embodiment of the present application also provides an electronic device 300 as shown in FIG. 11, and the electronic device 300 may include a readout circuit 310. The readout circuit 310 may be the readout circuit 200 in the foregoing embodiment, and a corresponding operation of the readout circuit 200 may be realized, which is not repeatedly described herein for brevity.

Optionally, the electronic device may further include a display screen 320. The display screen 320 may be a display screen with a self-emitting display unit, such as an organic light-emitting diode (OLED) display or a micro light-emitting diode (Micro-LED) display.

It should be noted that specific examples in embodiments of the present application are just intended to help a person skilled in the art better understand the embodiments of the present application, rather than for limiting the scope of the present application.

It should also be noted that terms used in embodiments of the present application and the claims appended hereto are merely for the purpose of describing particular embodiments, and are not intended to limit the embodiments of the present application. For example, the use of a singular form of "a", "the above" and "the" in the embodiments of the present application and the claims appended hereto are also intended to include a plural form, unless otherwise clearly indicated herein by context.

A person of ordinary skill in the art may be aware that units and algorithm steps in the examples described with reference to the embodiments disclosed in this specification may be implemented by electronic hardware or a combination of computer software and electronic hardware. Whether these functions are performed by hardware or software depends on particular applications and designed constraint conditions of the technical solutions. A person skilled in the art may use different methods to implement the described functions for each particular application, but it should not be considered that the implementation goes beyond the scope of the present application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that, the disclosed system, apparatus and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate components may or may not be physically separate, and components displayed as units may or may not be physical units, may be located in one position, or may be distributed on multiple network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such understanding, the nature of the technical solutions of the present application, or the part contributing to the prior art, or part of the technical solutions may be implemented in a form of software product. The computer software product is stored in a storage medium and includes several instructions for instructing a computer device (which may be a personal computer, a server, or a network device, and the like) to execute all of or part of the steps of the method described in the embodiments of the present application. The storage medium includes: various media that may store program codes, such as a U-disk, a removable hard disk, a read-only memory (ROM), a random access memory (RAM), a magnetic disk, a compact disk, and so on.

The foregoing descriptions are merely specific embodiments of the present application, but the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of this application shall be subject to the protection scope of the claims.

What is claimed is:

1. A readout circuit, wherein the readout circuit is configured to connect to a plurality of pixel circuits, and output signals of the plurality of pixel circuits are respectively input signals of the readout circuit, the readout circuit comprises:
a plurality of capacitors; a switch circuit; and an output circuit; wherein,
the plurality of capacitors are connected to the output circuit through the switch circuit;
the plurality of capacitors are configured to store output signals of the plurality of pixel circuits, respectively; and
the output circuit is configured to output signals stored by the plurality of capacitors through the switch circuit one-by-one;
wherein the output circuit comprises an operational amplifier configured to amplify and output the signals stored by the plurality of capacitors, the output circuit further comprises:
a feedback capacitor, a first switch, a second switch and a third switch;
wherein two ends of the first switch are connected to an input end and an output end of the operational amplifier, respectively, a left plate of the feedback capacitor is connected to the input end of the operational amplifier, a right plate of the feedback capacitor is connected to the output end of the operational amplifier through the third switch, and two ends of the second switch are connected to the right plate of the feedback capacitor and a voltage source, respectively.

2. The readout circuit according to claim 1, wherein the switch circuit comprises a plurality of switches, the plurality of switches are in one-to-one correspondence with the plurality of capacitors, and the output circuit is configured to output the signals stored by the plurality of capacitors one-by-one through sequential turn-on of the plurality of switches.

3. The readout circuit according to claim 2, wherein when the output circuit is configured to output a signal stored by an i-th capacitor of the plurality of capacitors, a switch corresponding to the i-th capacitor is turned on, and other switches in the switch circuit except the switch corresponding to the i-th capacitor are turned off.

4. The readout circuit according to claim 1, wherein the plurality of pixel circuits are pixel circuits in a same direction, the same direction is a same row or a same column.

5. The readout circuit according to claim 4, wherein a number of the plurality of capacitors is less than or equal to a number of the pixel circuits in the same direction.

6. The readout circuit according to claim 4, wherein the plurality of capacitors are configured to simultaneously sample and store the output signals of the plurality of pixel circuits.

7. The readout circuit according to claim 6, wherein when the plurality of capacitors simultaneously sample the output signals of the plurality of pixel circuits, all switches in the switch circuit are turned on.

8. An image sensor, comprising:
a readout circuit, wherein the readout circuit is configured to connect to a plurality of pixel circuits, and output signals of the plurality of pixel circuits are respectively input signals of the readout circuit, the readout circuit comprises:
a plurality of capacitors; a switch circuit; and an output circuit; wherein,
the plurality of capacitors are connected to the output circuit through the switch circuit;
the plurality of capacitors are configured to store output signals of the plurality of pixel circuits, respectively; and
the output circuit is configured to output signals stored by the plurality of capacitors through the switch circuit one-by-one;
wherein the output circuit comprises an operational amplifier configured to amplify and output the signals stored by the plurality of capacitors, the output circuit further comprises:
a feedback capacitor, a first switch, a second switch and a third switch;
wherein two ends of the first switch are connected to an input end and an output end of the operational amplifier, respectively, a left plate of the feedback capacitor is connected to the input end of the operational amplifier, a right plate of the feedback capacitor is connected to the output end of the operational amplifier through the third switch, and two ends of the second switch are connected to the right plate of the feedback capacitor and a voltage source, respectively.

9. An electronic device, comprising:
a readout circuit, wherein the readout circuit is configured to connect to a plurality of pixel circuits, and output signals of the plurality of pixel circuits are respectively input signals of the readout circuit, the readout circuit comprises:
a plurality of capacitors; a switch circuit; and an output circuit; wherein,
the plurality of capacitors are connected to the output circuit through the switch circuit;
the plurality of capacitors are configured to store output signals of the plurality of pixel circuits, respectively; and
the output circuit is configured to output signals stored by the plurality of capacitors through the switch circuit one-by-one;
wherein the output circuit comprises an operational amplifier configured to amplify and output the signals stored by the plurality of capacitors, the output circuit further comprises:
a feedback capacitor, a first switch, a second switch and a third switch;
wherein two ends of the first switch are connected to an input end and an output end of the operational amplifier, respectively, a left plate of the feedback capacitor is connected to the input end of the operational amplifier, a right plate of the feedback capacitor is connected to the output end of the operational amplifier through the third switch, and two ends of the second switch are connected to the right plate of the feedback capacitor and a voltage source, respectively.

10. The readout circuit according to claim 1, wherein when the readout mode of the readout circuit is row-by-row, the plurality of pixel circuits are pixel circuits in a same column;

when the readout mode of the readout circuit is column-by-column, the plurality of pixel circuits are pixel circuits in a same row.

11. The readout circuit according to claim 1, wherein a left plate of each capacitor in the plurality of capacitors is connected to an output end of each pixel circuit in the plurality of pixel circuits, and a right plate of each capacitor is connected to the output circuit through the switch circuit.

12. The readout circuit according to claim 1, wherein a number of the plurality of capacitors is the same as a number of the plurality of pixel circuits.

* * * * *